United States Patent [19]

Smothers et al.

[11] Patent Number: 5,024,909

[45] Date of Patent: * Jun. 18, 1991

[54] DRY FILM PROCESS FOR ALTERING WAVELENGTH RESPONSE OF HOLOGRAMS

[75] Inventors: William K. Smothers, Hockessin; Krishna C. Doraiswamy; Mark L. Armstrong, both of Wilmington, all of Del.

[73] Assignee: E. I. Du Pont de Nemours and Company, Wilmington, Del.

[ * ] Notice: The portion of the term of this patent subsequent to Sep. 25, 2007 has been disclaimed.

[21] Appl. No.: 536,792

[22] Filed: Jun. 12, 1990

Related U.S. Application Data

[63] Continuation of Ser. No. 380,933, Jul. 14, 1989, Pat. No. 4,959,283, which is a continuation-in-part of Ser. No. 144,840, Jan. 15, 1988, abandoned.

[51] Int. Cl.[5] .......................... G03H 1/04; G03H 1/06
[52] U.S. Cl. ............................................. 430/1; 430/2; 430/912; 350/3.61; 350/3.65; 350/3.67; 350/3.81
[58] Field of Search ................................ 430/1, 2, 912; 350/3.61, 3.65, 3.81, 3.67

[56] References Cited

U.S. PATENT DOCUMENTS

| | | | |
|---|---|---|---|
| 3,685,526 | 4/1972 | Haugh | 430/1 |
| 3,809,732 | 5/1974 | Chandross et al. | 264/22 |
| 3,993,485 | 11/1976 | Chandross et al. | 430/2 |
| 4,173,474 | 11/1979 | Tanaka et al. | 430/1 |
| 4,535,041 | 8/1985 | Fielding et al. | 430/1 |
| 4,786,125 | 11/1988 | Magarinos et al. | 350/3.65 |
| 4,802,719 | 2/1989 | Magarinos et al. | 350/3.7 |
| 4,959,283 | 9/1990 | Smothers et al. | 430/1 |

OTHER PUBLICATIONS

Wopschall et al., "Dry Photopolymer Film of Recording Holograms," Applied Optics, 9/1972, pp. 2096-2097.
W. C. Hay 2rd, B. D. Guenther, "Characterization of Polaroid's DMP-128 Holographic Reocrding Photopolymer," SPIE, vol. 883 (1988), pp. 102-105.
R. T. Ingwall and M. Troll, "The Mechanism of Hologram Formation in DMP-128 Photopolymer", SPIE, vol. 883, (1988), pp. 94-101.
Chandross et al., "Latest-Image Photopolymer Systems," Applied Optics, vol 17, No. 4, 2/1978, pp. 566-573.

Primary Examiner—Charles L. Bowers, Jr.
Assistant Examiner—Patrick Doody

[57] ABSTRACT

Wavelength response of volume holograms is altered by contact with a dry film diffusion element.

31 Claims, 1 Drawing Sheet

DRY FILM PROCESS FOR ALTERING WAVELENGTH RESPONSE OF HOLOGRAMS

CROSS REFERENCE TO RELATED APPLICATIONS

This is a continuation division of U.S. application Ser. No. 07/380,933, filed July 14, 1989 U.S. Pat. No. 4,959,283, now U.S. Pat. No. 4,959,283, which in turn is a continuation-in-part of U.S. Ser. No. 07/144,840, Process of Forming Reflection Holograms in Photopolymerizable Layers, filed Jan. 15, 1988, now abandoned.

FIELD OF THE INVENTION

This invention relates to refractive index imaging and, more particularly, to a process for altering the wavelength response of a volume phase hologram.

DISCUSSION OF BACKGROUND AND PRIOR ART

In refractive index imaging, a pattern of varying refractive indices, commonly referred to as a phase hologram, is created within the material used to record the image. Holograms formed by directing a reference beam and an object beam of coherent light to enter the recording medium from opposite sides, so that the beams travel through the medium in approximately opposite directions, are known as "reflection holograms". Intersection of the object and reference beams in the recording medium forms interference fringes of material having varying refractive indices. The interference fringes lie in planes approximately parallel to the plane of the recording medium, and reflect light having approximately the same wavelength that was used to create the fringes. Hence, the hologram is viewed in reflection.

A variety of materials have been used to record volume holograms. Among the more important are: silver halide emulsions, hardened dichromated gelatin, photorefractives, ferroelectric crystals, photopolymers, photochromics and photodichroics. Characteristics of these materials are given in *Volume Holography and Volume Gratings*, Academic Press, New York, 1981, Chapter 10, pp. 254–304 by L. Solymar and D. J. Cook.

Dichromated gelatin is currently the material of choice for making reflection holograms due to its high resolution, and high values of refractive index modulation (i.e., high diffraction efficiency and wide bandwidth). However, dichromated gelatin has poor shelf life and requires wet processing after the material has been imaged to contain a reflection hologram. Due to its poor shelf life, the material must be freshly prepared shortly before imaging or prehardened gelatin must be used, which reduces image efficiency. Wet processing introduces an additional step in preparation of the hologram, and causes dimensional changes in the material as it swells, then shrinks, during processing. These dimensional changes affect spacing of the interference fringes. Thus, it is difficult and time consuming to reproducibly make high quality reflection holograms with dichromated gelatin.

Substantially solid, photopolymer films have heretofore been proposed for use in making holograms. U.S. Pat. No. 3,658,526 to Haugh, for instance, discloses preparation of stable, high resolution transmission holograms from solid, photopolymerizable films by a single step process wherein a permanent refractive index image is obtained by a single exposure to a coherent light source bearing holographic information. The holographic image thus formed is not destroyed by subsequent uniform exposure to light, but rather is fixed or enhanced.

More recently, excellent photopolymer systems for recording reflection holograms have been developed, as described hereinafter. As with all systems for recording reflection holograms, these substantially solid photopolymer systems reflect light having approximately the same wavelength as that used to record the hologram.

The most convenient source of coherent light to record holograms is a laser, which emits a narrow waveband of light at fixed wavelengths. For example, a krypton laser emits (red) light having a 647 nm wavelength, a helium/neon laser emits (red) light having a 633 nm wavelength and an argon laser emits (blue-green) light having a 488 or 514 nm wavelength. It may be desired to shift the wavelength of light reflected by the hologram to a different wavelength. Such a shift is achieved with prior art reflection holograms imaged in dichromated gelatin, silver halide or photopolymer film by immersing or covering the surface with a liquid solvent, which is absorbed into the matrix, swelling the hologram, and thereby causing a shift (i.e., an increase) in the reflected wavelength. This method of shifting the reflection wavelength requires liquid processing, which is both messy and difficult to control in large production runs. Thus, there is a need for an improved process to shift the reflected wavelength of reflection holograms in general, and in particular for the substantially solid photopolymer holographic recording systems described herein.

SUMMARY OF THE INVENTION

The present invention provides a process for forming a reflection hologram in a substantially solid, transparent, photosensitive film element by sequentially:

(a) holographically exposing the film element to coherent light to record a hologram within the element, and (b) contacting the film element with a diffusion element for a time sufficient to modify the wavelength of light response by the hologram.

The photosensitive film generally contains a binder, a monomer, a photoinitiator system, and optional components such as plasticizers, thermal stabilizers, and the like. Upon exposure to coherent light, the photoinitiator system causes the monomer to polymerize, recording the interference fringes. Monomer in the non-exposed regions then diffuses into the polymerized regions until polymerized by flooding with light, heating, or the like, which "fixes" the pattern of differing refractive index material forming the reflection hologram.

Preferred photopolymerizable compositions that may be selected in practicing the invention contain:

(a) approximately 25 to 90% of a polymeric binder selected from the group consisting of polyvinyl acetate, polyvinyl butyral, polyvinyl acetal, polyvinyl formal, interpolymers containing major segments thereof, and mixtures thereof;

(b) approximately 5 to 60% of an ethylenically unsaturated monomer selected from the group consisting of carbazole containing monomers and a liquid monomer containing one or more phenyl, biphenyl, phenoxy, naphthyl, naphthyloxy, heteroaromatic group containing up to three aromatic rings, chlorine and bromine;

(c) approximately 0 to 25% of a plasticizer; and (d) approximately 0.1 to 10% of a photoinitiator system activatable by actinic radiation wherein said percentages are weight percentages based on total film weight.

Optical elements formed by these preferred compositions typically will have a refractive index modulation of at least 0.001, preferably 0.0050 or higher, when imaged with coherent light to contain a volume hologram.

In one embodiment, the Diffusion Element contains a monomer and/or plasticizer that diffuses into the photosensitive film, after the film has been imaged to contain a reflection hologram, causing the binder to swell, and thereby increasing the wavelength of reflected light to increase by increasing the spacing between the interference fringes. If a monomer is selected as the diffusion agent, the shift is readily "fixed" by polymerizing the monomer when the desired results have been obtained. The monomer or plasticizer may be a component contained in the photosensitive film, or have a similar refractive index. If the Diffusion Element is made of the polymer that serves as the binder in the photosensitive film, or is a compatible transparent material, it may be permanently laminated to the film to serve as a protective overcoat. Otherwise, the Diffusion Element may be removed after it has performed its function.

In another embodiment, the Diffusion Element may be constructed of a material that absorbs plasticizer or other diffusable components contained in the photosensitive film. In this case, photosensitive film shrinks as plasticizer diffuses into the Diffusion Element, decreasing the spacing between the interference fringes and thereby causing the film to reflect light having a shorter wavelength.

DETAILED DESCRIPTION OF THE INVENTION

Figure 1:
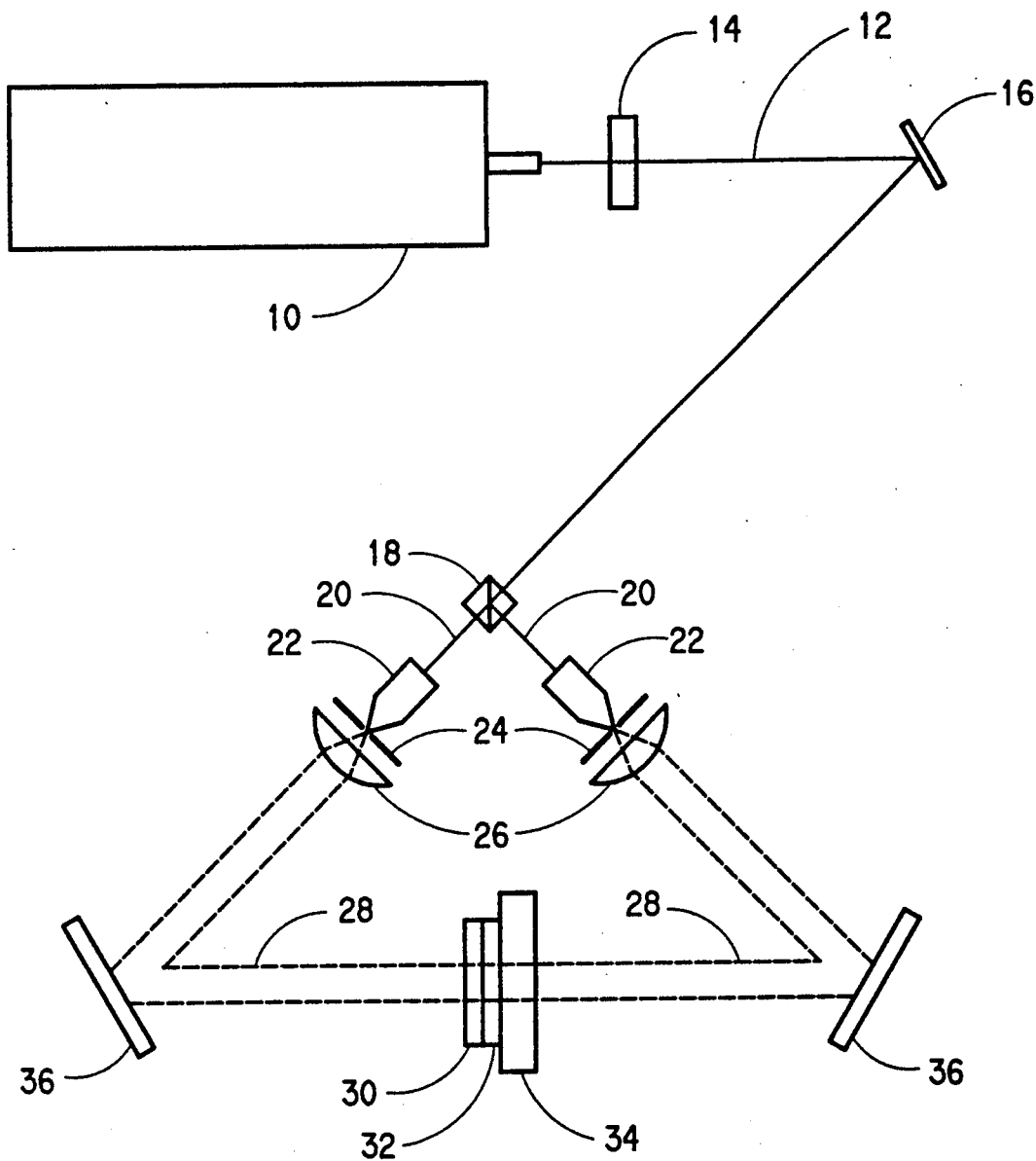
FIG. 1 illustrates an off-axis method of forming a reflection hologram.

The invention will now be further described with respect to preferred Optical Elements that contain reflection holograms and have excellent holographic properties and particular utility in diverse application such as graphic arts, notch filters, head up displays, and components of optical circuits.

OPTICAL ELEMENT

The Optical Element, prior to imaging, is a substantially solid, transparent, photosensitive film that is cast or laminated to a transparent support that provides structural integrity for the composition (referred to herein as a film) as it is processed. Since the photosensitive film typically will be only 1 to 100 micrometers in thickness, the support is necessary to prevent film rupture or any stretching during processing that would affect spacing of the interference fringes created in the film that form the holographic image.

The transparent support must have sufficient optical quality that it does not unduly absorb or scatter coherent light passing through it during formation of the hologram. Also, the support must be sufficiently flexible that it will not separate from the film as the film is brought into contact with its permanent mounting surface, such as a curved substrate (e.g., a windshield or helmet visor). Less, if any, flexibility will be needed if the permanent mounting surface is planar, such as a sheet of glass. Exemplary transparent supports that may be selected to advantage include polyethylene terephthalate film, polymethyl methacrylate, polycarbonate, and cellulose triacetate.

Components of the film include a binder, an ethylenically unsaturated monomer, optionally a plasticizer, and a photoinitiator system. Upon exposure to coherent light as described hereinafter, the monomer polymerizes to form higher molecular weight polymers having a different refractive index and rheological properties than unexposed area of the film. Although the film is substantially solid, components interdiffuse before, during, and after the exposure to coherent light until they are fixed by a final uniform exposure to actinic radiation or by thermal treatment at elevated temperatures. The film typically has a thickness of approximately 1 to 100 micrometers. Thinner films generally will not achieve useful reflection efficiencies. The film reflects light having a spectral and angular bandwidth determined by the thickness and refractive index modulation of the film. Thus, the film thickness is matched to the desired optical requirements and the optical system used with the hologram (i.e., the display source). In general, relatively thick films will be selected for narrow bandwidth applications, and relatively thin films will be selected for broad bandwidth applications.

BINDER

The binder is the most significant component affecting physical properties of the substantially solid photopolymerizable film. The binder also serves as a matrix for the monomer and photoinitiator system prior to exposure, provides the base line refractive index, and after exposure contributes to the physical and refractive index characteristics needed to form the reflection hologram. Cohesion, adhesion, flexibility, miscibility and tensil strength, in addition to index of refraction, are some of the properties to be considered in selecting the binder for a specific application. Binders that may be selected to advantage include polyvinyl acetate, polyvinyl butyral, polyvinyl acetal, polyvinyl formal, interpolymers containing major segments of these polymers, and mixtures thereof. Comonomers may be included in preparing the polymer, such as ethyl vinyl ether, to modify chemical and mechanical properties of the binder in conventional fashion.

Fluorine containing binders, such as copolymers of a vinyl ester and a fluorinated monomer, are included in scope of binders that may be selected to advantage when it is desired to achieve a high refractive index modulation. For example, refractive index modulation values higher than 0.04, and as high as 0.06 to 0.075, are readily achieved through the selection of binders containing approximately 5% to 25% by weight fluorine. Particularly useful binders of this class are copolymers of vinyl acetate and a perfluorinated monomer such as tetrafluoroethylene and/or hexafluoropropylene. Other fluorinated monomers, such as vinyl fluoride and vinylidene fluoride also may be selected.

MONOMERS

The film contains at least one ethylenically unsaturated monomer that is capable of free radical initiated addition polymerization, has a boiling point above 100° C., and is compatible with the coating solvent. The monomer usually will contain the unsaturated group in the terminal position. A liquid monomer will generally be selected, but solid monomers can be used to advantage, generally in combination with one or more liquid monomers, provided the solid monomer is capable of interdiffusion in the substantially solid film composition.

A preferred class of monomers for use in the compositions of this invention are liquid, ethylenically unsaturated compounds capable of addition polymerization and having a boiling point above 100° C. which contains one or more moieties taken from the group consisting of a substituted or unsubstituted phenyl, biphenyl, phenoxy, naphthyl, naphthyloxy, and heteroaromatic groups containing up to three aromatic rings; chlorine; and bromine. The monomer contains at least one such moiety and may contain two or more of the same or different moieties of the group, provided the monomer remains liquid. Substituted groups such as lower alkyl, alkyoxy, hydroxy, phenyl, phenoxy, carboxy, carbonyl, amino, amido, imido, cyano or combinations thereof, may be present provided that the monomer remains liquid and diffusable in the photopolymerizable layer. Representative liquid monomers include: 2-phenoxyethyl acrylate, 2-phenoxyethyl methacrylate, phenol ethoxylate monoacrylate, 2-(p-chlorophenoxy)ethyl acrylate, p-chlorophenyl acrylate, phenyl acrylate, 2-phenylethyl acrylate, 2-(1-naphthyloxy)ethyl acrylate, o-biphenyl methacrylate, o-biphenyl acrylate, and mixtures thereof.

While most monomers useful in this invention are liquids, they may be used in admixture with one or more ethylenically unsaturated solid monomers such as the ethylenically unsaturated carbazole monomers disclosed in H. Kamogawa, et al., *Journal of Polymer Science: Polymer Chemistry Edition*, Vol. 18 (1979), pp 9-18; 2-naphthyl acrylate; pentachlorophenyl acrylate; 2,4,6-tribromophenyl acrylate; bisphenol A diacrylate; 2-(2-naphthyloxy)ethyl acrylate; N-phenyl maleimide; p-biphenyl methacrylate; 2-vinylnaphthalene; 2-naphthyl methacrylate; N-phenyl methacrylamide; and t-butylphenyl methacrylate.

Ethylenically unsaturated carbazole monomers containing a vinyl group attached to the nitrogen atom of the carbazole moiety typically are solids. Suitable monomers of this type include N-vinyl carbazole and 3,6-dibromo-9-vinyl carbazole. A particularly preferred mixture of ethylenically unsaturated monomers comprises N-vinyl carbazole in combination with one or more of the above liquid monomers, in particular, with 2-phenoxyethyl acrylate, phenol ethoxylate monoacrylate, ethoxylated bisphenol A diacrylate, or mixtures thereof.

If crosslinking of the photopolymer is desired, up to about five weight percent of at least one multifunctional monomer containing two or more terminal ethylenically unsaturated groups may be incorporated into the composition. The polyfunctional monomer must be compatible with the other components of the composition and is preferably a liquid. Suitable multifunctional monomers include di-(2-acryloxyethyl)ether of bisphenol A, ethoxylated bisphenol A diacrylate, triethylene glycol diacrylate, trimethylol propane triacrylate, and the like. A preferred crosslinking agent is ethoxylated bisphenol A diacrylate.

PHOTOINITIATOR SYSTEM

The initiator system comprises one or more compounds which directly furnish free-radicals when exposed to actinic radiation. By "actinic radiation" is meant radiation which is active to produce the free-radicals necessary to initiate polymerization of the monomeric material. It can also comprise a plurality of compounds, one of which yields the free-radicals after having been caused to do so by another compound, or sensitizer, which is activated by the radiation. Useful photoinitiator systems typically will contain a photoinitiator and a sensitizer which extends the spectral response into the near ultraviolet, the visible, and/or near infrared spectral regions. A large number of free-radical generating compounds can be utilized. Redox systems, especially those involving dyes, e.g., Rose Bengal/2-dibutylaminoethanol, may be used. Photoreducible dyes and reducing agents, as well as dyes of the phenazine, oxazine, and quinone classes; ketones; quinones; azinium salts as disclosed in U.S. Pat. No. 4,743,531; dye-borate complexes as disclosed in U.S. Pat. No. 4,772,541; and trichloromethyl triazines as disclosed in U.S. Pat. Nos. 4,772,534 and 4,774,163 can be used to initiate photopolymerization. A useful discussion of dye sensitized photopolymerization can be found in "Dye Sensitized Photopolymerization" by D. F. Eaton in *Adv. in Photochemistry*, Vol. 13, D. H. Volman, G. S. Hammond, and K. Gollinick, eds., Wiley-Interscience, New York, 1986, pp. 427-487.

Preferred initiator systems are 2,4,5-triphenylimidazolyl dimers with chain transfer agents, or hydrogen donors, and mixtures thereof, sensitized by visible sensitizers. Preferred 2,4,5-triphenylimidazolyl dimers include CDM-HABI, i.e., 2-(o-chlorophenyl)-4,5-bis(m-methoxyphenyl)-imidazole dimer; o-Cl-HABI, i.e., 1,1'-biimidazole, 2,2'-bis (o-chlorophenyl)-4,4'5,5'-tetraphenyl-; and TCTM-HABI, i.e., 1H-imidazole, 2,5-bis(o-chlorophenyl)-4-[3,4-dimethoxyphenyl]-, dimer, each of which is typically used with a hydrogen donor.

A preferred group of sensitizers include the bis(p-dialkylaminobenzylidine) ketones disclosed in Baum and Henry, U.S. Pat. No. 3,652,275 and the arylyide ketones disclosed in Dueber, U.S. Pat. No. 4,162,162. Particularly preferred sensitizers include the following: DEAW, i.e., cyclopentanone, 2,5-bis[4-(diethylamino)-phenyl]methyl-ene]-; and JAW, i.e., cyclopentanone, 2,5-bis[(2,3,6,7- tetrahydro-1H,5H-benzo[i,j]quinolizin-1-yl)methylene]-. Other particularly useful sensitizers are cyclopentanone, 2,5-bis[2-(1,3-dihydro-1,3,3-trimethyl-2H-indol-2-ylidene)ethylidene], CAS 27713-85-5; and cyclopentanone, 2,5-bis-[2-ethylnaphtho[1,2-d]thiazol-2(1H)-ylidene)ethylidene], CAS 27714-25-6.

Suitable hydrogen donors include: 2-mercaptobenzoxazole, 2-mercaptobenzothiazole, 4-methyl-4H-1,2,4,triazole-3-thiol, and the like. Other suitable hydrogen donor compounds, which are preferred for compositions which contain N-vinyl carbazole monomer, are 5-chloro-2-mercaptobenzothiazole; 2mercaptobenzothiazole; 1H-1,2,4-triazole-3-thiol; 6-ethoxy-2-mercaptobenzothiazole; 4-methyl-4H-1,2,4-triazole-3-thiol; 1-dodecanethiol; and mixtures thereof.

OTHER COMPONENTS

Other components conventionally added to photopolymer compositions can be present to modify the physical properties of the film. Such components include: plasticizers, thermal stabilizers, optical brighteners, ultraviolet radiation absorbing material, adhesion modifiers, coating aids, and release agents.

A plasticizer may be present to modify adhesion, flexibility, hardness, and other mechanical properties of the film in conventional fashion. Candidate plasticizers include triethylene glycol dicaprylate, triethylene glycol bis(2-ethylhexanoate), tetraethylene glycol diheptanoate, diethyl sebacate, dibutyl suberate, tris(2-ethylhexyl) phosphate, Brij ® 30 [$C_{12}H_{25}(OCH_2CH_2)_4OH$], and Brij ® 35 [$C_{12}H_{25}(OCH_2CH_2)_{20}OH$]Other plasticizers that yield equivalent results will be apparent to those skilled in the art.

In cases in which a mixture of a solid and a liquid monomer are present, plasticizer may be substituted for some or all of the liquid monomer, provided that the mixture of plasticizer and monomer remains liquid. It will also be appreciated that a mixture of plasticizer and solid monomer may be used, provided that the mixture of plasticizer and monomer remains liquid.

A thermal polymerization inhibitor normally will be present to improve the storage stability of the composition. Useful thermal stabilizers include: hydroquinone, phenidone, p-methoxyphenol, alkyl and aryl-substituted hydroquinones and quinones, t-butyl catechol, pyrogallol, beta-naphthol, 2,6-di-t-butyl-p-cresol, phenothiazine, and chloranil. The dinitroso dimers described in Pazos, U.S. Pat. No. 4,168,982, are also useful. Since monomers usually contain thermal polymerization inhibitors added by their manufacturers, it may not be necessary to add additional inhibitor.

Nonionic surfactants may be added to the photopolymerizable composition as coating aids. Preferred coating aids are fluorinated nonionic surfactants, such as Fluorad ® FC-430 and Fluorad ® FC-431.

Useful optical brighteners include those disclosed in Held, U.S. Pat. No. 3,854,950. A representative optical brightener is 7-(4'-chloro-6'-diethylamino-1',3',5'-triazine-4'-yl) amino 3-phenyl coumarin. Other useful ultraviolet radiation absorbing materials are disclosed in Held, U.S. Pat. No. 3,854,950.

PHOTOPOLYMERIZABLE FILM

Proportions of ingredients in the film generally will be within the following percentage ranges, based on total weight of the composition: binder, 25 to 90%, preferably 45 to 75%; monomer, 5 to 60%, preferably 15 to 50%; plasticizer, 0 to 25%, preferably 0 to 15%; photoinitiator system, 0.1 to 10%, preferably 1 to 7%; and optional ingredients, 0 to 5%, typically 1 to 4%. If the amount of binder is below approximately 25%, or the amount of monomer exceeds approximately 60%, the composition has insufficient viscosity to form a substantially solid film. The presence of binder is held within approximately 90% since performance is unduly lost at higher levels of addition, and resulting films have diminished values of refractive index modulation. Likewise, levels of monomer used will be at least approximately 5% since lower quantities will not produce films having practical values of refractive index modulation.

The composition may be directly coated onto the transparent support described hereinbefore, or may be cast as a film that is then laminated to the transparent support by conventional methods. In either case the transparent support generally provides only temporary dimensional stability for the photopolymer film prior to mounting on its permanent substrate, and thus the support is releasable from the film. For some applications, however, it may be desired to retain the support as a permanent overcoat or protective layer for the photopolymer film, in which case the support and photopolymer film may be permanently bonded. The other side of the supported photopolymer film may have a temporary protective cover sheet, such as a polyethylene or polypropylene film, releasably adhered thereto. Conventional intermediate layers or coatings may be used to facilitate the adhesive and/or release characteristics desired for a particular application.

EXPOSURE TO PRODUCE OPTICAL ELEMENT

Referring to FIG. 1, a reflection hologram is formed, using the "off-axis" technique, by exposing the film to the intersection of two counter propagating laser beams. The laser (10) produces a laser beam (12) which is controlled by a shutter (14). The laser beam (12) is directed by a mirror (16) into a beam splitter (18) wherein the beam is divided into two beams (20). Each beam segment (20) passes through a microscope objective (22), pinhole (special filter) (24), and collimating lens (26) to produce an expanded, collimated beam (28). Each expanded, collimated beam (28) is reflected by a mirror (36) to converge in the photopolymerizable layer (32). In graphic arts applications, the object being reloaded in the hologram takes the place of the mirror in the path of one of the beams in conventional fashion. The photopolymerizable layer (32) typically is mounted on a glass plate (34) and protected by a polyethylene terephthalate film support (30).

Interference fringes are created within the photopolymerizable layer by intersecting the two beams in the layer. In the embodiment shown in FIG. 1, the glass plate can be tilted to an angle of 5° to 70° from the line perpendicular to the axis of the two beams. The interference fringes thereby created in the photopolymer can be slanted (i.e., the fringes are at an angle to the film plane). The fringes function as a mirror for light having a wavelength similar to that used to form the. fringes, when impacting the film at the same angle that was used to form the fringes.

Alternatively, one may use an "on-axis" technique for imaging the film. In this case a coherent beam of light, such as a collimated 488 nm argon-ion laser beam, is projected onto one surface of the film, typically at an angle up to 70° from the normal to the film plane. The collimated beam in part functions as a "reference beam", while a portion is transmitted through the layer and reflected back by a mirror or object mounted behind the film, thereby functioning as an "object beam". Intersection of the reference beam and object beam, in the film, forms interference fringes that are oriented substantially parallel to the film plane. These fringes form a reflection hologram, which functions as a mirror, when viewed with light projected on the front surface of the film. A potential difficulty with the "on-axis" mode of operation may occur if the film and its support absorb a substantial portion of the beam used to image the film, in which case the reflected object beam may be too weak to form a satisfactory hologram. If this should occur, however, the film formulation may be adjusted to minimize the problem.

It has been found to be advantageous to preheat the film, and then image the film while it still is at an elevated temperature. In this embodiment the film is heated to a moderate temperature, typically in the range of approximately 30° to 50° C., and then exposed to the coherent light source while the film is still warm. Preheating has been found to improve reflection efficiency of the imaged film and to increase photospeed. Thus, preheating permits use of a lower energy laser and/or allows the imaging step to be completed more quickly.

After the holographic mirror has been formed by either of these techniques, the image is fixed by flooding the film with actinic radiation. This may be achieved by exposing the film to normal room light, but it is preferred to flood the surface with higher intensity light, ultraviolet light, or a combination thereof, to complete polymerization of the monomer component of the film.

IMAGE ENHANCEMENT

Reflection holograms formed using the films described above may be thermally treated to enhance reflection efficiency up to about 100%. In this embodiment, a reflection holographic mirror is first formed in the film as described above. The film is then heated to a temperature above 50° C., and preferably between 80° and 160° C., for a commensurate time period to maximize enhancement. Two to three fold improvements in refractive index modulation are readily achieved. Thermal enhancement treatment may be carried out either before or after the image is fixed by flooding the film with actinic radiation as described above, but typically it is carried out after the fixing step. The thermal treatment may concurrently fix the enhanced hologram by thermally hardening or polymerizing the photopolymerizable material in the hologram. Both the rate of thermal enhancement and the rate of thermal hardening increase with increasing temperature, with most of the benefits being achieved during early stages. For example, when using a 100° C. enhancement temperature most of the enhancement occurs during the first 5 to 10 minutes, with little further improvement occurring after one hour.

In the practice of this embodiment, the reflection hologram is heated by any conventional method. For example, the film may be heated in a simple convection oven, irradiated with infrared or microwave radiation, or contact heated on a hot shoe or in a lamination press. Whichever means is used, care is needed to prevent distortion or damage to the photopolymer layer containing the reflection hologram.

DIFFUSION ELEMENT

After the photosensitive film has been imaged to contain a reflection hologram, and optionally after the hologram has been enhanced as described above, the resulting Optical Element is brought into contact with a Diffusion Element that modifies the wavelength of light reflected by the hologram.

In a preferred embodiment, the Diffusion Element contains a liquid monomer and/or plasticizer that will diffuse into and swell the Optical Element. Intimate contact is required to achieve uniform diffusion over the surface of the Optical Element. Thus, the Diffusion Element generally will be a film, containing the diffusion agent, that can readily be laminated to the Optical Element, or a coating composition that, when dried, adheres to the Diffusion Element. In many applications it will be desired to retain the Diffusion Element in place after it has served the purpose of processing the hologram. Thus, the Diffusion Element generally has sufficient clarity that it will not unduly interfere with use of the Optical Element in applications where light must pass through the Diffusion Element.

The primary component of the Diffusion Element is conveniently the binder employed in the Optical Element, or a compatible material having a similar refractive index, and the diffusion agent is conveniently a monomer or plasticizer employed in the Optical Element, or a compatible material having a similar refractive index. Selection of these materials readily achieves the purposes of the invention, without unduly affecting properties of the Optical Element or requiring a subsequent step of removing the Diffusion Element after its purposes have been achieved.

The amount of diffusion agent contained in the Diffusion Element must be sufficient that the desired shift in reflected wavelength can be achieved. The level of diffusion is readily monitored by exposing the Optical Element to incident light of the desired wavelength. When the desired shift has been obtained, further diffusion is arrested. If the diffusion agent is a monomer, further diffusion is stopped, and the shift in reflected wavelength is "fixed", by polymerizing the monomer. Polymerization is readily achieved by flooding the Optical Element and Diffusion Element with light having the appropriate wavelength, typically ultraviolet light, or by heating the Elements to the appropriate temperature. Alternatively, the Diffusion Element may be removed from the Optical Element when the desired shift has been achieved, or the Diffusion Element may contain the exact level of diffusion agent that produce the desired shift at equilibrium.

In another embodiment, the Diffusion Element absorbs plasticizer or other diffusable material contained in the Optical Element, thereby causing shrinkage and a decrease in the wavelength of light reflected by the hologram. As in the case of the embodiment described above, the Diffusion Element Conveniently is primarily composed of the binder employed in the Optical Element, or a similar material, to enhance intimate contact between the two Elements (achieved by laminating or coating the Diffusion Element to the Optical Element), and to provide a material into which the material will diffuse. The extent of diffusion is monitored and the Diffusion Element is removed when the desired shift has been achieved. Alternatively, a Diffusion Element may be selected that absorbs the exact level of plasticizer needed to produce the desired shift at equilibrium.

The rate of diffusion is affected by the temperature of the Optical and Diffusion Elements. Thus, the benefits of the invention may be achieved more readily if the Elements are heated while in contact provided that extreme temperatures are avoided that would cause degradation of the Elements or, in the case of monomer diffusion, premature polymerization.

The degree of swelling or shrinking may vary across the thickness of the Optical Element, with the most pronounced effect being achieved near the interface of the Diffusion and Optical Elements. Thus, a diffusion gradient may be produced causing nonuniform fringe spacing and an increased bandwidth of light reflected by the hologram. Accordingly, thicker Optical Elements, containing more interference fringes, generally will be selected for a broad bandwidth response and thinner Optical Elements, containing fewer interference fringes, will be selected for a narrower bandwidth response.

It also has been found that dark storage of the Optical and Diffusion Elements in intimate contact at room temperature for a prolonged time (e.g., several hours), followed by heating to an elevated temperature such as 100° C., may cause the Optical Element to contain multiple holograms that will reflect light of different wavelengths. Thus, it is possible to "multiplex" holograms by employing the process of this invention.

OTHER EMBODIMENTS

The invention has been described above with respect to a preferred embodiment, wherein a reflection hologram is imaged in particularly preferred photopolymerizable film compositions to produce an Optical Element having an exceptional refractive index modulation. In its broader aspects, the invention also may be used to process transmission holograms (also a volume phase hologram) that are formed by conventional techniques. Also, the invention may be used to advantage to process (e.g., shift the wavelength of response of) volume holograms contained in other photosensitive materials, such as photopolymer films such as those disclosed by Haugh (U.S. Pat. No. 3,658,526); dichroma gelatin; silver halide films; and other substantially solid film elements known in the art.

EVALUATION OF CANDIDATE FILMS

To evaluate candidate films, holographic mirrors are prepared and values determined for reflection efficiency at the wavelength of maximum reflection. Refractive index modulation (M) is then calculated from the reflection efficiency and film thickness.

Film elements are prepared comprising, in order: a 0.05 mm clear polyethylene terephthalate film support; a dried layer of the candidate photopolymerizable composition having a thickness of 5 to 20 micrometers; and a 0.023 mm polyethylene terephthalate cover sheet. The film elements are cut into uniform sections, the cover sheet is removed, and the sections are laminated by contacting the tacky photopolymerizable composition onto a glass plate. The film support is left in place to protect the photopolymerizable composition during exposure and handling operations.

Holographic mirrors are formed in the candidate film compositions mounted on front-surface mirrors with a thin layer of xylene inbetween, using the "on-axis" technique previously described, by exposure to the $TEM_{oo}$ mode of a collimated 514 nm argon-ion laser beam oriented perpendicular to the film plane and reflecting back on itself. After exposure to record the holographic mirror, the film element is overall exposed to ultraviolet and visible light. The exposed film element is heat processed by placing it in a conventional forced-air convection oven at 100° C. for 30 to 60 min. The transmission spectrum of each holographic mirror is recorded from 400-700 nm using a conventional spectrophotometer. The intensity of light transmitted through the film at the wavelength of maximum reflection ($I_{trans}$), is measured as well as the intensity of light transmitted through the film in areas where there is no holographic Image ($I_o$). Maximum reflection efficiency ($\eta$), is calculated from the formula:

$$\eta = [1-(I_{trans}/I_o)].$$

Refractive index modulation of the holographic mirror is calculated from the maximum reflection efficiency ($\eta$) using Kogelnik's coupled wave theory, which for an unslanted holographic mirror in which the incident radiation is perpendicular to the plane of the mirror, is represented by the formula:

$$\eta = \tanh^2\left[\frac{\pi M d}{\lambda}\right]$$

where
$\eta$ = the maximum reflection efficiency;
M = refraction index modulation;
$\lambda$ = probe radiation wavelength in free space; and
d = mirror (i.e., film) thickness.

Solving this equation for M, refractive index modulation is calculated as:

$$M = \left[\frac{\lambda \tanh^{-1}\sqrt{\eta}}{\pi d}\right]$$

Refractive index modulation represents the magnitude of differences in refractive index within the film after it has been imaged to contain the reflection hologram. It is not thickness dependent, but describes the inherent capability of the film composition to record a refractive index change, i.e., reflection hologram. Films having higher refractive index modulations will have higher reflection efficiencies and bandwidths at the same thickness.

INDUSTRIAL APPLICATIONS

The process of this invention is useful in general for the preparation of reflection holograms having a shifted wavelength response from the source used to create the hologram, and for the preparation of holograms having a broader bandwidth of response. The process provides a convenient alternative to wet processing methods and offers the advantages of simple effective control of the desired results. Preferred Optical Elements, having compositions described herein before imaging, will typically be 10 to 100 micrometers in thickness and have a reflection efficiency in the order of 70% to 99%.

Holographic Optical Elements prepared by the process of this invention can be used in a variety of applications. Reflection holograms can be used in displays as, for example, in advertising or packaging; in security applications as, for example, on credit cards, bank notes, lottery tickets, and the like; for information storage; and for the preparation of holographic devices such as holographic mirrors.

Holographic mirrors have certain advantages over conventional mirrors: (1) they can be produced by a photographic process making them potentially low cost in mass production, (2) the optical configuration is independent of the substrate configuration, (3) they can be spectrally sensitive, performing as narrow band rejection filters, and (4) the physical weight can be insignificant in comparison to that of conventional optics. Important application of holographic mirrors include holographic notch filters and head-up displays.

A notch filler rejects a selected narrow band of radiation and provides maximum transmission outside the selected band. Holographic notch filters provide eye and instrument protection against laser radiation in military applications.

A head-up display is a form of optical combiner, a dual function optical element that simultaneously performs as an optical window (which transmits a nearly undistorted transmitted image) and as an analog of a conventional mirror or lens. A head-up display employs a holographic mirror, commonly called an optical combiner, mounted in front of an observer. When information is projected onto the mirror at the wavelength which the holographic mirror reflects, the observer sees the information projected on the mirror. However, the observer is able to see the outside world through the mirror since the holographic mirror reflects only a narrow band of radiation. Head-up displays are used in aircraft and have been proposed for use in automobiles.

EXAMPLES

The invention will now be further illustrated by reference to the following examples, in which copolymer compositions are given as percent by weight.

| GLOSSARY | |
|---|---|
| BHT | Butylated hydroxytoluene; 2,6-di-tert-butyl-4-methylphenol; CAS 128-37-0 |
| Butacite ® film | Poly(vinyl)butyral, plasticized with 4G7 |
| DEAW | Cyclopentanone, 2,5-bis[[4-(diethylamino)-2-phenyl]methylene]- |
| FC-430 | Fluorad ® FC-430, fluorinated nonionic surfactant; CAS 11114-17-3; 3M Company |
| FC-431 | Fluorad ® FC-431, liquid nonionic surfactant; 50% solution of fluoroaliphatic polymeric esters in ethyl acetate; 3M Company |
| 4G7 | Tetraethylene glycol diheptanoate |
| 2-HPA | 2-Hydroxypropyl acrylate; propyleneglycol monoacrylate |
| JAW | Cyclopentanone, 2,5-bis[2,3,6,7-tetrahydro-1H,5H-benzo[i,j]quinolizin-9-yl)methylene]- |
| MMT | 4-Methyl-4H-1,2,4-triazole-3-thiol; CAS 24854-43-1 |
| NVC | N-Vinyl carbazole; 9-vinyl carbazole; CAS 1484-13-5 |
| o-Cl-HABI | 1,1'-Biimidazole, 2,2'-bis[o-chlorophenyl]-4,4',5,5'-tetraphenyl-; CAS 1707-68-2 |
| Photomer ® 4039 | Phenol ethoxylate monoacrylate; CAS 56641-05-5; Henkel Process Chemical Company |
| POEA | 2-Phenoxyethyl acrylate; CAS 48145-04-6 |
| PVB | Poly(vinyl butyral), M.W. 36,000; CAS 63148-65-2 |
| Sartomer 349 | Ethoxylated bisphenol A dicarylate; CAS 24447-78-7; Sartomer Company, West Chester, PA |
| TDA | Triethyleneglycol diacrylate; CAS 1680-21-3 |
| TDC | Triethyleneglycol dicaprylate; CAS 106-10-5 |
| TMPTA | Trimethylolpropane triacrylate; 2-ethyl-2-(hydroxymethyl)-1,3-propanediol triacrylate; CAS 15625-89-5 |
| Vinac ® B-15 | Poly(vinylacetate); M.W. 90,000; CAS 9003-20-7 Air Products |
| Vinac ® B-100 | Poly(vinylacetate); M.W. 500,000; CAS 9003-20-7 Air Products |

GENERAL PROCEDURES

Film Preparation

Coating solutions without sensitizing dyes were prepared in amber bottles under yellow or red light by adding the components to the solvents while mixing with a mechanical stirrer until completely dissolved. All components were used as received from the suppliers without further purification. The sensitizing dyes, DEAW or JAW, were added under red light and all subsequent operations on solutions and their resulting films were performed under red light only.

A Talboy coater equipped with a 10-mil doctor knife, 12 ft drier set at 40°–50° C., and a laminator station was used to coat the solutions onto a 4-mil thick clear film support of polyethylene terephthalate (Mylar ® polyethylene terephthalate film). A cover sheet 0.92-mil polyethylene terephthalate was laminated to the coatings as they emerged from the drier. Coating samples were stored in black polyethylene bags at room temperature until used.

Sample Evaluation

Coated film with both the film support and coversheet intact was cut into 4×5-inch (10×13 cm) sections and sandwiched between a clear glass plate and the front surface of an aluminum mirror. A thin layer of xylene was used to optically couple the glass and mirror to the film. Holographic mirrors were recorded in the film by exposing with a collimated 488 nm argon-ion laser beam orientated perpendicular to the film surface so that the beam travelled through the glass plate, xylene, polyethylene terephthalate coversheet, coating, polyethylene terephthalate support, and xylene, and then was reflected back by the mirror through the xylene, polyethylene terephthalate support, coating, polyethylene terephthalate coversheet, xylene, and glass plate. In all cases, the laser beam had an intensity of 10 mW/cm$^2$, and a diameter of 2–3 cm.

After laser exposure, the glass and mirror were removed and the film was overall exposed to ultraviolet and visible light using the output of a Theimer-Strahler #5027 mercury-arc photopolymer lamp (Exposure Systems Corp., Bridgeport, CT) mounted in a Douthitt DCOP-X (Douthitt Corp., Detroit, MI) exposure unit. Unless otherwise indicated, the coating was thermally processed at 100° C. in a forced-air convection oven following exposure.

The transmission spectrum of each holographic image was recorded from 400–700 nm using a Perkin Elmer model Lambda-9 spectrophotometer. The maximum reflection efficiency (RE), wavelength of maximum reflection (lmax), and bandwidth at half maximum (fwhm) were determined from the transmission spectrum.

EXAMPLE 1

This is an example of a low molecular weight poly(vinyl acetate) based composition for recording reflection holograms and use of this composition produce automobile windshield safety glass with a reflection hologram internally mounted (as might be used for head-up displays).

The following composition was prepared: 28.48 g of Vinac B-15 (57%); 2.50 g TMPTA (5.0%); 10.00 g POEA (20.0%); 6.00 g NVC (12.0%); 2.0 g o-Cl HABI (4.0%); 1.0 g MMT (2.0%); 0.015 g DEAW (0.03%); 0.005 g BHT (0.01%); 7.5 g methanol and 142.5 g dichloromethane. The composition was coated on polyethylene terephthalate to produce a 24.2 micron film, mounted on a glass plate, and exposed as described in the general procedures except that no xylene was used.

The unprocessed holographic mirror on glass, film support removed, was analyzed by recording and analyzing its transmission spectrum. The mirror had a reflection efficiency of 65%, a bandwidth at half maximum (fwhm) of 4 nm, and a wavelength of maximum reflection of 477 nm. The refractive index modulation was 0.0070.

A sheet of 30 mil (0.76 cm) Butacite ® film was then placed over the mirror and a second piece of glass placed on side opposite the Butacite ® film thus forming a composite with the following structure: glass, holographic mirror, Butacite ® film, glass. The composite structure was clamped tightly together and heated to 150° C. under vacuum for 60 min. in a vacuum oven. The composite structure was then removed from the vacuum oven, allowed to cool to room temperature, and analyzed by recording and measuring its transmission spectrum. The processed mirror, now part of a safety glass composite, had a reflection efficiency of 85%, a bandwidth at half maximum (fwhm) of 50 nm, and a wavelength of maximum reflection of 498 nm. The refractive index modulation was 0.0130.

EXAMPLE 2

The procedure of Example 1 was repeated with the following composition: 28.48 g of Vinac B-15 (57%); 4.50 g TMPTA (9.0%); 8.00 g POEA (16.0%); 6.00 g NVC (12.0%); 2.0 g o-chloro HABI (4.0%); 1.0 g MMT (2.0%); 0.015 g DEAW (0.03%); 0.005 g BHT (0.01%); 7.5 g methanol and 142.5 g dichloromethane. The coating had a thickness of 23.2 microns. The unprocessed mirror had a reflection efficiency of 57%, a bandwidth at half maximum (fwhm) of 4 nm, and a wavelength of maximum reflection of 476 nm. The refractive index modulation was 0.0064. The processed mirror, now part of a safety glass composite, had a reflection efficiency of 80%, a bandwidth at half maximum (fwhm) of 33 nm, and a wavelength of maximum reflection of 503 nm. The refractive index modulation was 0.0100.

EXAMPLE 3

The procedure of Example 1 was repeated with the following composition: 14.24 g of Vinac B-15 (57%); 1.25 g TMPTA (5.0%); 3.75 g POEA (15.0%); 3.00 g NVC (12.0%); 1.25 g 2-HPA (5.0%); 1.0 g o-chloro HABI (4.0%); 0.5 g MMT (2.0%); 0.0075 g DEAW (0.03%); 0.0025 g BHT (0.01%); 3.75 g methanol and 71.25 g dichloromethane. The coating had a thickness of 21.5 microns. The unprocessed mirror had a reflection efficiency of 50%, a bandwidth at half maximum (fwhm) of 4 nm, and a wavelength of maximum reflection of 477 nm. The refractive index modulation was 0.0062. The processed mirror, now part of a safety glass composite, had a reflection efficiency of 85%, a bandwidth at half maximum (fwhm) of 55 nm, and a wavelength of maximum reflection of 510 nm. The refractive index modulation was 0.0121.

EXAMPLE 4

The following composition was prepared: 66.0% Vinac B-100; 17.0% Photomer ® 4039; 7.9% NVC; 3.0% Sartomer 349; 3.7% o-chloro HABI; 2.1% MMT; 0.2% FC-431; and 0.08% JAW. The composition was dissolved in 97% dichloromethane - 3% 2-propanol (about 22% by weight total solutes) and coated on 50 micron polyethylene terephthalate support with a 23 micron polyethylene terephthalate coversheet as describe din the general procedures. The coating was about 25 microns thick.

With the support and coversheet in place a non-slanted holographic mirror was recorded in the film using a 514 nm argon-ion laser beam (80–90 mW/cm²) as described in the general procedures. The exposure was about 60 mJ/cm². The film containing the mirror was exposed to ultraviolet and visible radiation for 1 min as described in the general procedures and heated in an oven at 100° C. for 1 hour.

The 23 micron polyethylene terephthalate coversheet was removed from the film containing the exposed and processed mirror, and from a piece of unexposed film having the same composition and dimensions. The unexposed film was pressure laminated to the exposed and processed film to form a laminated element having the following structure: polyethylene terephthalate support, exposed and processed film, unexposed film, and polyethylene terephthalate support. The laminated element was heated in an oven at 100° C. The reflection efficiency (RE), wavelength of maximum reflection (λmax), and bandwidth , are given in Table 1.

TABLE 1

| Heating Time (min) | RE (%) | λmax (nm) | fwhm (nm) |
| --- | --- | --- | --- |
| 0 | 99.8 | 513 | 12 |
| 10 | 99.6 | 588 | 16 |
| 20 | 99.4 | 586 | 18 |
| 30 | 99.1 | 586 | 24 |
| 60 | 99.1 | 575 | 24 |
| 240 | 99.0 | 580 | 24 |
| 660 | 99.7 | 578 | 24 |

EXAMPLE 5

Following the procedure of Example 4, a film containing a non-slanted holographic mirror was prepared, exposed to ultraviolet and visible radiation, and heated in an oven at 100° C. for 1 hour. The 23 micron polyethylene terephthalate coversheet was removed from the film containing the exposed and processed mirror and from a piece of unexposed film having the same composition and the same dimensions. The unexposed film was pressure laminated to the exposed and processed film to form a laminated element having the following structure: polyethylene terephthalate support, exposed and processed film, unexposed film, and polyethylene terephthalate support. The laminated element was placed in a light tight container and allowed to stand at room temperature. After 1 hour of processing, the absorbance profile exhibited two peaks. The reflection efficiency (RE), wavelength of maximum reflection (λmax), and bandwidth (fwhm) of both of the peaks (indicated by RE1 and RE2, etc.) are given in Table 2. After 19 hours the film sample was heated in an oven at 100° C. for 1 hour.

TABLE 2

| Time (hr) | RE 1 (%) | RE 2 (%) | λmax 1 (nm) | λmax 2 (nm) | fwhm 1 (nm) | fwhm 2 (nm) |
| --- | --- | --- | --- | --- | --- | --- |
| 0 | 99.8 | — | 513 | — | 12 | — |
| 1 | 99.0 | 18.7 | 513 | 600 | 19 | 12 |
| 4 | 98.1 | 33.9 | 513 | 606 | 34 | 12 |
| 19 | 93.2 | 52.1 | 512 | 605 | 52 | 12 |
| 20[a] | 99.5 | — | 579 | — | 24 | — |

[a]The film was heated in an oven at 100° C. after 19 hr.

EXAMPLES 6–9

The following composition was prepared: 66.0% Vinac B-100; 17.0% Photomer ® 4039; 7.9%; NVC; 3.0% Sartomer 349; 3.7% o-chloro HABI; 2.1% MMT; 0.2% FC-430; and 0.08% JAW. The composition was dissolved in 97% dichloromethane - 3% 2-propanol (about 17.5% by weight total additives) and coated on 50 micron polyethylene terephthalate support with a 23 micron polyethylene terephthalate coversheet as described in the general procedures. The coating thickness was about 25 microns.

With the support and coversheet in place holographic mirrors were recorded in the film using a 514 nm argon-ion laser beam (80–90 mW/cm$^2$) as described in the general procedures. The exposure was about 60 mJ/cm$^2$. The film containing the mirrors was exposed to ultraviolet and visible radiation for 1 min and heated in an oven at 100° C. for 30 min.

The films described in Table 3 were prepared. The solids were coated from 1 17.5% solids solution from 97% dichloromethane - 3% 2-propanol using a 10-mil doctor knife on 50 micron polyethylene terephthalate support with a 23 micron polyethylene terephthalate coversheet - as described in the general procedures.

TABLE 3

| Component | Weight % of Solids | | | |
|---|---|---|---|---|
| | Film A | Film B | Film C | Film D |
| Vinac ® B-100 | 40 | 50 | 60 | 70 |
| 4G7 | 10 | 10 | 10 | 10 |
| Photomer ® 4039 | 50 | 40 | 30 | 20 |

The coversheet was removed from a film containing a holographic mirror and from one of the films described in Table 3 the two films laminated together so that the coatings were in contact and the resulting laminated element heated in an oven at 100° C. for 45 min. The changes in reflection efficiency (RE), wavelength of maximum reflection (λmax), and bandwidth at half maximum (fwhm) with heating time are given in Table 4.

TABLE 4

| Film | λmax (nm) | | RE (%) | | fwhm (nm) | |
|---|---|---|---|---|---|---|
| | Before | After | Before | After | Before | After |
| A | 512 | 720 | 83 | 35 | 8 | 24 |
| B | 512 | 578 | 77 | 63 | 8 | 11 |
| C | 512 | 666 | 90 | 64 | 9 | 17 |
| D | 512 | 622 | 91 | 83 | 9 | 16 |

What is claimed is:

1. A process for forming a volume phase hologram in a substantially solid, transparent, photosensitive film element comprising, in sequence:
   (a) holographically exposing said film element to coherent light to record a volume hologram within said element;
   (b) flooding said film element with actinic radiation to fix the volume hologram; and
   (c) contacting said film element with a diffusion element for a time sufficient to modify the wavelength of light response by the hologram.

2. The process of claim 1 wherein the photosensitive film element is a photopolymer.

3. The process of claim 2 wherein said diffusion element contains a monomer, a plasticizer, or mixture thereof, that diffuses into said film to increase the wavelength of light reflected by the reflection hologram.

4. The process of claim 3 including the step of polymerizing monomer that has diffused into said film element.

5. The process of claim 4 wherein the diffused monomer is polymerized by heating the film.

6. The process of claim 4 wherein the diffused monomer is polymerized by exposure to ultraviolet light.

7. The process of claim 1 wherein non-volatile component diffuses from said photosensitive film into said diffusion element.

8. The process of claim 1 wherein said diffusion element is laminated to said photosensitive film.

9. The process of claim 8 wherein said lamination is permanent.

10. The process of claim 8 wherein said diffusion element is removed from said photosensitive film after the desired shift in wavelength reflection has been achieved.

11. The process of claim 1 wherein the photosensitive film and diffusion element are heated while in contact to increase the rate of diffusion.

12. A process for forming a volume hologram in a substantially solid, transparent, photopolymerizable film element comprising, in sequence:
   (a) holographically exposing said film element to coherent light to record a hologram within said element, said film element consisting essentially of:
      (1) approximately 25 to 90% of a polymeric binder selected from the group consisting of polyvinyl acetate, polyvinyl butyral, polyvinyl acetal, polyvinyl formal, interpolymers containing major segments thereof, and mixtures thereof;
      (2) approximately 5 to 60% of an ethylenically unsaturated monomer selected from the group consisting of carbazole containing monomers and a liquid monomer containing one or more phenyl, biphenyl, phenoxy, naphthyl, naphthloxy, heteroaromatic group containing up to three aromatic rings, chlorine and bromine;
      (3) approximately 0 to 25% of a plasticizer; and
      (4) approximately 0.1 to 10% of a photoinitiator system activatable by actinic radiation wherein said percentages are weight percentages based on total film weight,
   (b) flooding said film element with actinic radiation to fix the volume hologram; and
   (c) contacting said optical element with diffusion element for a time sufficient to modify the wavelength of light reflected by the reflection hologram.

13. The process of claim 12 wherein said diffusion element contains a monomer, a plasticizer, or mixture thereof, that diffuses into said film element to increase the wavelength of light reflected by the hologram.

14. The process of claim 13 wherein the material diffusing into the optical element has a refractive index similar to that of a component of the film element.

15. The process of claim 13 wherein the material diffusing into the optical element is a monomer or plasticizer component of the film element.

16. The process of claim 13 including the step of polymerizing monomer that has diffuses into said film element.

17. The process of claim 14 wherein the diffused monomer is polymerized by heating the film element.

18. The process of claim 14 wherein the diffused monomer is polymerized by exposure to ultraviolet light.

19. The process of claim 13 wherein the optical element and film element are heated while in contact to increase the rate of diffusion.

20. The process of claim 12 wherein non-volatile plasticizer diffuses from said film element into said diffusion element.

21. The process of claim 20 wherein the film element and diffusion element are heated while in contact to increase the rate of diffusion.

22. The process of claim 12 wherein said diffusion element is coated onto said film element.

23. The process of claim 12 wherein said diffusion element is a film and is laminated onto said film element.

24. The process of claim 23 wherein the lamination is permanent.

25. The process of claim 22 or 24 wherein the primary component of the diffusion element is the binder component of the film element.

26. The process of claim 22 or 24 wherein said diffusion element is removed from said film element after the desired shift in wavelength reflection has been achieved.

27. The process of claim 1 or 12 wherein the actinic radiation comprises ultraviolet light.

28. The process of claim 1 including the step of heating the film element after step (b) and prior to step (c).

29. The process of claim 28 wherein the film element and diffusion element are heated while in contact to increase the rate of diffusion.

30. The process of claim 12 including the step of heating the film element after step (b) and prior to step (c).

31. The process of claim 30 wherein the film element and diffusion element are heated while in contact to increase the rate of diffusion.

* * * * *

UNITED STATES PATENT AND TRADEMARK OFFICE
CERTIFICATE OF CORRECTION

PATENT NO. : 5,024,909

DATED : June 18, 1991

INVENTOR(S) : William K. Smothers, Hockessin; Krishna C. Doraiswamy;
Mark L. Armstrong, both of Wilmington, all of Del.

It is certified that error appears in the above-identified patent and that said Letters Patent is hereby corrected as shown below:

On the title page, item [75] should be corrected to read as follows:

-- Inventors: William K. Smothers, Hockessin; Krishna C. Doraiswamy; Mark L. Armstrong, both of Wilmington; Torence J. Trout, Yorklyn, all of Del. --.

Signed and Sealed this

Eighth Day of December, 1992

Attest:

DOUGLAS B. COMER

Attesting Officer

Acting Commissioner of Patents and Trademarks